(12) United States Patent
Taguchi et al.

(10) Patent No.: US 8,456,001 B2
(45) Date of Patent: Jun. 4, 2013

(54) PRESSURE-CONTACT SEMICONDUCTOR DEVICE

(75) Inventors: Kazunori Taguchi, Fukuoka (JP); Kenji Oota, Chiyoda-ku (JP)

(73) Assignee: Mitsubishi Electric Corporation, Tokyo (JP)

( * ) Notice: Subject to any disclaimer, the term of this patent is extended or adjusted under 35 U.S.C. 154(b) by 345 days.

(21) Appl. No.: 11/684,140

(22) Filed: Mar. 9, 2007

(65) Prior Publication Data

US 2008/0073767 A1   Mar. 27, 2008

(30) Foreign Application Priority Data

Sep. 26, 2006   (JP) ................................ 2006-260422

(51) Int. Cl.
*H01L 29/74*   (2006.01)
(52) U.S. Cl.
USPC ............................ 257/730; 257/181; 257/182
(58) Field of Classification Search
USPC ................................................. 257/181, 182
See application file for complete search history.

(56) References Cited

U.S. PATENT DOCUMENTS

| | | | |
|---|---|---|---|
| 3,739,235 A | | 6/1973 | Kessler, Jr. |
| 4,131,905 A | * | 12/1978 | Hanes et al. .................. 257/116 |
| 4,257,058 A | * | 3/1981 | Ferro et al. .................... 257/116 |
| 4,399,452 A | * | 8/1983 | Nakashima et al. .......... 257/689 |
| 4,542,398 A | * | 9/1985 | Yatsuo et al. .................. 257/166 |
| 4,719,500 A | * | 1/1988 | Tokunoh ........................ 257/182 |
| 5,121,189 A | * | 6/1992 | Niwayama .................... 257/688 |
| 5,278,434 A | * | 1/1994 | Niwayama .................... 257/181 |
| 5,345,096 A | * | 9/1994 | Gruning ......................... 257/182 |
| 2005/0016757 A1 | * | 1/2005 | Schwamborn et al. ... 174/120 R |
| 2006/0038268 A1 | * | 2/2006 | Scholz et al. .................. 257/678 |
| 2006/0228595 A1 | * | 10/2006 | Fujita et al. ....................... 429/9 |

FOREIGN PATENT DOCUMENTS

| | | |
|---|---|---|
| EP | 0 096 266 | 12/1983 |
| EP | 0096266 | * 12/1983 |
| EP | 62090951 | * 4/1987 |
| GB | 1 362 499 | 8/1974 |
| JP | 52-61962 | 5/1977 |
| JP | 54-8975 | 1/1979 |
| JP | 56-35439 | 4/1981 |
| JP | 56-83951 | 7/1981 |
| JP | 57-50439 | 3/1982 |
| JP | 58-74351 | 5/1983 |

(Continued)

OTHER PUBLICATIONS

Office Action issued May 31, 2011, in Japanese Patent Application No. 2006-260422 (with English-language translation).

*Primary Examiner* — Julio J Maldonado
*Assistant Examiner* — Mohammad Choudhry
(74) *Attorney, Agent, or Firm* — Oblon, Spivak, McClelland, Maier & Neustadt, L.L.P.

(57) ABSTRACT

A pressure-contact semiconductor device (100) includes thermal buffer plates (2) and main electrode blocks (3) having flanges (4), by which semiconductor substrate (1) having a pair of electrodes is sandwiched, disposed opposed to each side thereof, wherein the semiconductor substrate (1) is sealed in a gastight space by joining the flanges (4) to insulating container (5). The semiconductor device (100) is configured such that the outermost periphery of the semiconductor substrate (1) is enclosed by hollow cylindrical insulator (9) fitted on outer peripheries of the main electrode blocks (3) in the gastight space with O-rings (8) fitted between the main electrode blocks (3) and the cylindrical insulator (9), and sealed with reaction force from the O-rings (8).

13 Claims, 16 Drawing Sheets

FOREIGN PATENT DOCUMENTS

| | | |
|---|---|---|
| JP | 60-103647 | 6/1985 |
| JP | 61-125143 | 6/1986 |
| JP | 62-90951 | 4/1987 |
| JP | 5-259302 | 10/1993 |
| JP | 259302 * | 10/1993 |
| JP | 6-177272 | 6/1994 |
| JP | 2006-521685 | 9/2006 |
| WO | WO 2004/075290 A1 | 9/2004 |

* cited by examiner

PRESSURE-CONTACT SEMICONDUCTOR DEVICE

BACKGROUND OF THE INVENTION

1. Field of the Invention

The present invention relates to pressure-contact semiconductor devices, in particular, explosion-proof structures of packages therefor.

2. Description of the Related Art

Pressure-contact semiconductor devices have been used in various fields of application systems such as inverters for industrial use and drive devices of fans and pumps. In these systems, an excessive short-circuit current (accident current) such as lightning-surge current may happen to flow, which needs an explosion-proof of a pressure-contact semiconductor device from system protection point of view.

In a conventional pressure-contact semiconductor device, a semiconductor chip (semiconductor substrate) is sandwiched between external electrodes (main electrode blocks) disposed on the top and bottom thereof, and tightly sealed by joining metal flanges attached to the external electrodes to the top and bottom of an external-surrounding insulator (insulating container). Two annular partition insulators (elastic members) are interposed, in parallel to each other inside the flanges in the surrounding insulator, across the outer peripheral surfaces of the external electrodes and the inner wall of the surrounding insulator, which prevents arcs, generated at the time of breakage of the semiconductor chip, from blowing out through weak portions such as the flanges to outside the package of the semiconductor device (refer to, for example, Japanese Patent Laid-Open No. 5-259302, FIG. 1 (Patent Document 1) and Japanese Patent Laid-Open No. 56-35439, FIG. 2 (Patent Document 2)).

In the conventional pressure-contact semiconductor device, since the annular partition insulators are interposed, in parallel to each other inside the flanges in the surrounding insulator, across the outer peripheral surfaces of the external electrodes and the inner wall of the surrounding insulator, the annular partition insulators are fitted onto the outer peripheral surfaces of the external electrodes and the inner wall of the surrounding insulator, to protect the flanges. In order to improve explosion-proof, a structure is required that makes no clearances at fitting portions between the partition insulator and the outer peripheral surfaces of the external electrodes or the inner wall of the surrounding insulator. Since radial centering is necessary in welding the flange, clearances are generally made between the external electrodes and the partition insulators in order to allow tolerance of these parts. For that reason, arcs generated from the semiconductor chip may sometimes reach through the clearances the outside of the device as breaking through the flanges. Therefore, sufficient explosion resistance has not been obtained.

On the other hand, in order to construct to eliminate the clearances, a machining process such as grinding or abrading needs to be implemented to improve dimensional accuracy of the surrounding insulator, the external electrodes, and the like. Moreover, even in a case of eliminating the clearances, works such as press-fitting of the elastic members are involved in the assembly processes. Consequently, its workability lowers and a substantial time is required to assemble them, which considerably increases its costs.

SUMMARY OF THE INVENTION

The present invention is made to solve problems as described above, and an object of the invention is to obtain a pressure-contact semiconductor device that has high reliability and high performance of explosion-proof that suppresses arcs, generated accompanied by breakage of a semiconductor substrate due to a short circuit current or the like, from blowing out from the device package.

A pressure-contact semiconductor device of the present invention includes: a semiconductor substrate having a pair of electrodes each on the front and back sides thereof; a pair of thermal buffer plates and a pair of main electrode blocks, each buffer plate and each electrode block having a flange, being provided opposed to the respective electrodes on the semiconductor substrate such that the substrate is sandwiched therebetween; and an insulating container provided between each flange of the main electrode blocks so as to surround the semiconductor substrate; wherein the pressure-contact semiconductor device is configured such that the semiconductor substrate is sealed in a gastight space created by joining the insulating container to each flange, and O-rings are placed on, and a hollow cylindrical insulator is fitted onto, each electrode-side outer peripheral surface of the main electrode blocks in the gastight space.

A pressure-contact semiconductor device of the invention is provided with an insulator between a semiconductor substrate and flanges, and with O-rings to eliminate clearances between the semiconductor substrate and each of the flanges. Therefore, the pressure-contact semiconductor device can suppress arcs, generated accompanied by breakage of the semiconductor substrate due to a short circuit current or the like, from blowing out from the device package.

DESCRIPTION OF THE PREFERRED EMBODIMENTS

Figure 1:
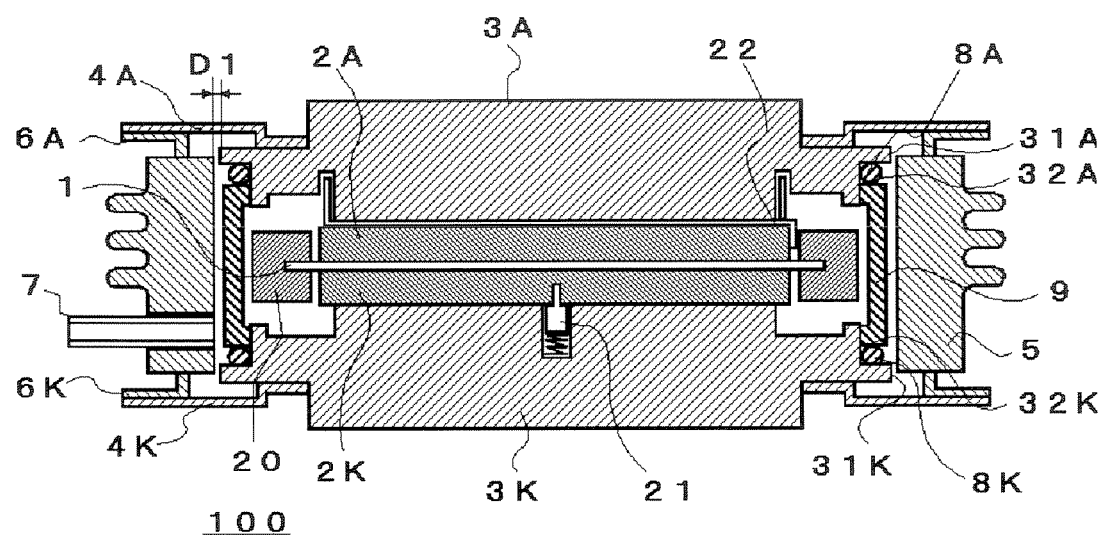
FIG. 1 is a cross-sectional view illustrating a pressure-contact semiconductor device according to Embodiment 1 of the present invention.

Hereinafter, aspects of the present invention will be explained with reference to the accompanying drawings. In the figures, identical or equivalent parts or components are assigned the same reference numerals and their explanations will be simplified or omitted.

Embodiment 1

Figure 2:
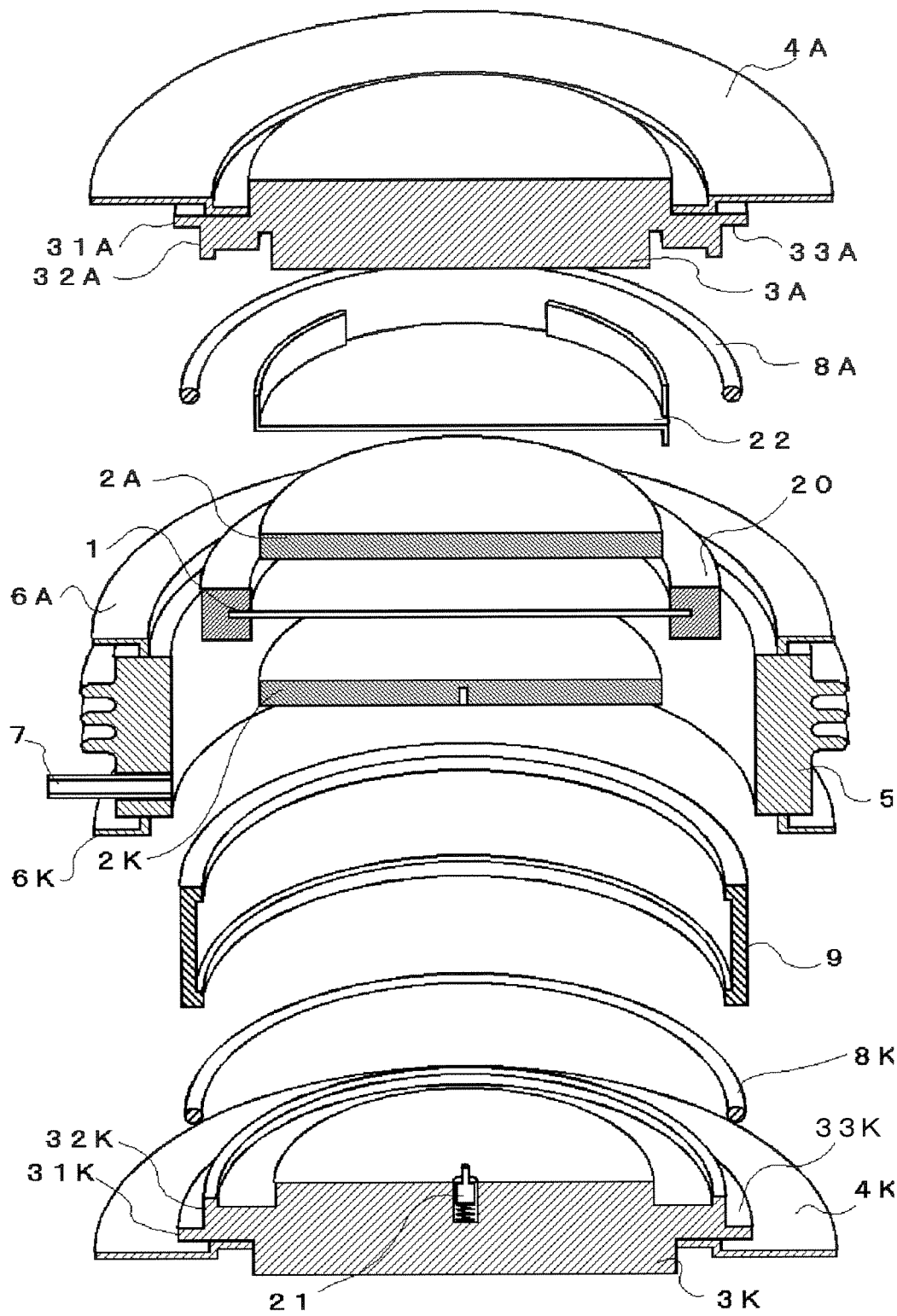
FIG. 2 is a perspective cross-sectional view illustrating a configuration of the pressure-contact semiconductor device according to Embodiment 1 of the invention.

FIG. 1 is a cross-sectional view illustrating a pressure-contact semiconductor device 100 in Embodiment 1 of the present invention, and FIG. 2, a perspective cross-sectional view illustrating a configuration thereof before assembly. Referring to FIGS. 1 and 2, a semiconductor substrate 1 for the semiconductor device 100, in which a diode or the like is formed, has an anode and cathode electrodes on a pair of main surfaces: the front and back surfaces of the semiconductor substrate. A pair of thermal buffer plates 2 and a pair of main electrode blocks 3 each are disposed on the anode and cathode sides, so that the semiconductor substrate 1 is sandwiched therebetween. (As for reference numerals used in the figures and the following explanations, it is noted that components associated with the anode side are assigned "A" and those with the cathode side, "K", subsequent to their own reference numerals, and components associated with both sides are indicated by their own reference numerals only.) The semiconductor substrate 1 is provided with a protector 20 made of silicon resin or the like on the outermost peripheral portion thereof. When the semiconductor substrate 1 is made of silicon, molybdenum is used for the thermal buffer plates 2 because the thermal expansion rate of molybdenum is nearly the same as that of silicon. The main electrode blocks 3 are made of copper, which has high electric and thermal conductivity. The semiconductor substrate 1 is not fixed between each of the thermal buffer plates 2 and of the main electrode blocks 3 by soldering with a brazing alloy, but is sandwiched in contact with them by mechanical pressing force so as to be electrically connected.

The main electrode blocks 3 are attached with flanges 4. A cylindrical insulating container 5, made of an electrical insulating material such as ceramics, surrounding the lateral side of the semiconductor substrate 1 is provided with flanges 6 on the top and bottom ends of the container. The semiconductor device 100 is configured in such a package structure that the semiconductor substrate 1 is enclosed by the main electrode blocks 3 and the insulating container 5 together with the flanges 4 and the flanges 6, in a gastight space sealed by joining the flanges 4 to the flanges 6. In addition, the flanges 4 and the flanges 6 are made of a nickel-iron alloy.

Moreover, a positioning pin 21 or a positioning member 22 is provided between the thermal buffer plates 2 and the main electrode blocks 3 in order for components to be placed in position in the assembly process. A gas-replacement pipe 7 is provided extending through the lateral side of the insulating container 5 so that a gas in the gastight space can be replaced with inert gas through the pipe.

In Embodiment 1, the main electrode blocks 3 each on the anode and cathode sides have first outer peripheral surfaces 31 and second outer peripheral surfaces 32 in the gastight space, both of which diameters are larger than that of the semiconductor substrate 1. The first outer peripheral surfaces 31 are formed on the flanges 4 sides of the main electrode blocks 3 and have diameters larger than those of the second outer peripheral surfaces 32. Steps 33 formed between the first and second outer peripheral surfaces 31 and 32 of the main electrode blocks 3 clamp an insulator, which is described later, via O-rings. In addition, the first outer peripheral surfaces 31 are formed in proximity to the inner wall of the insulating container 5, for example, to such an extent that the clearances between each of the surfaces and the wall may be kept sufficient for assembling the main electrode blocks 3 and the insulating container 5.

O-rings 8 are fitted on the second outer peripheral surfaces 32 of the main electrode blocks 3 so as to be in contact with the steps 33 between the first and second outer peripheral surfaces 31 and 32. A hollow cylindrical insulator 9 is fitted across the anode and cathode sides of the second outer peripheral surfaces 32 so that the respective O-rings 8 are pressed against the steps 33 in vertical directions toward the semiconductor substrate 1.

The insulator 9, in cooperation with the main electrode blocks 3 and the O-rings 8, shields the semiconductor substrate 1 from the flanges 4, the flanges 6, and the insulating container 5 so as to suppress arcs, generated when the semiconductor substrate 1 is overloaded, from reaching the flanges 4, the flanges 6, and the insulating container 5, which can prevent the device from breaking. Accordingly, the insulator 9 is usually made of fluoropolymer such as Teflon™ or polyimide resin that has high rigidity to withstand force from the O-rings 8 and high thermal stability (200° C. or higher). Moreover, the O-rings 8 are preferably made of a thermally stable material such as silicon rubber or fluororubber.

In addition, a through hole (not shown) is formed in the lateral side of the insulator 9 to ensure a path to the semiconductor substrate 1, through which internal gas is replaced through a gas-replacement pipe 7 fitted into the hole. In order to secure high explosion resistance, the through hole is preferably formed small with a diameter of, for example, about one mm to suppress the amount of arcs blowing out from the insulator 9. In contrast, from necessity of efficient replacement of internal gas at the time of assembly, a plurality of through holes may be formed to disperse the path for the gas.

Here, an assembly process of the pressure-contact semiconductor device 100 in Embodiment 1 will be briefly explained as follows:

a) First, the anode and cathode sides of the main electrode blocks 3 having been attached with the flanges 4 are prepared, and the O-rings 8 are fitted onto the second outer peripheral surfaces 32 of the main electrode blocks 3;

b) The insulating container 5 is prepared, and a flange 6K extending from the bottom end thereof and a flange 4K of a cathode-side main electrode block 3K are welded together;

c) The positioning pin 21 is set in the cathode-side main electrode block 3K, and a cathode-side thermal buffer plate 2K is placed on the main electrode block 3K;

At that process, the thermal buffer plate 2K is fixed in place with the positioning pin 21;

d) The insulator 9 is fitted onto an outer peripheral surface 32K of the main electrode block 3K and put on an O-ring 8K;

e) The semiconductor substrate 1 and an anode-side thermal buffer plate 2A are stacked together on the cathode-side thermal buffer plate 2K, and the positioning member 22 is placed on the buffer plate 2A; and f) Finally, an anode-side main electrode block 3A is stacked with an outer peripheral surface 32A being fitted onto the insulator 9, and a flange 6A extending from the top end of the insulating container 5 and a flange 4A of the anode-side main electrode block 3A are welded together.

Up to that process, the assembly is completed.

The pressure-contact semiconductor device 100 configured as described above is provided with the insulator 9 between the semiconductor substrate 1 and each of the flanges 4 and the flanges 6 to eliminate clearances between each of the main electrode blocks 3 and the insulator 9 by placing the O-rings 8, which can suppress arcs, generated accompanied by breakage of the semiconductor substrate due to a short circuit current or the like, from blowing out from the flanges to outside the device package.

Moreover, the above-described configuration eliminates necessity for high dimensional accuracy and for press-fitting of elastic members in the assembly process, which improves workability, allowing the device to be manufactured at low costs.

Furthermore, since a conventional pressure-contact semiconductor device is configured such that elastic members cover flange portions, which involves a relatively large usage of silicon rubber, gas may sometimes be produced in long-term use depending on its use environment. In the configuration of Embodiment 1, on the contrary, since use of silicon rubber is limited to the O-rings, the usage can be reduced, which can also suppress gas production.

Embodiment 2

Figure 3:
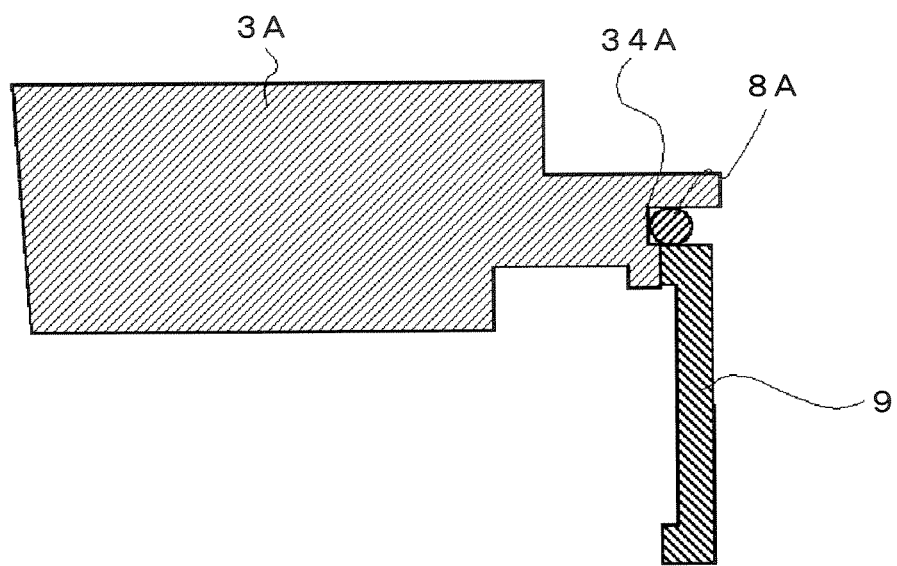
FIG. 3 is a partial cross-sectional view of a pressure-contact semiconductor device according to Embodiment 2 of the present invention.

In Embodiment 1, if the O-rings 8 are fitted onto the main electrode blocks 3 in a twisted state, the O-rings 8 may not remain in predetermined positions, and furthermore, slip out from the main electrode blocks 3 in some cases. For that reason, circumferential grooves 34 are formed in the second outer peripheral surfaces 32 of the main electrode blocks 3 as shown in the partial cross-sectional view of FIG. 3 (anode side). By fitting the O-rings 8 into the grooves 34, the O-rings 8 can be fixedly placed in the predetermined positions. Consequently, the O-rings 8 do not slip out from the main electrode blocks 3, which allow a semiconductor device to be configured that has an explosion-proof structure and is easy to assemble.

Embodiment 3

Figure 4:
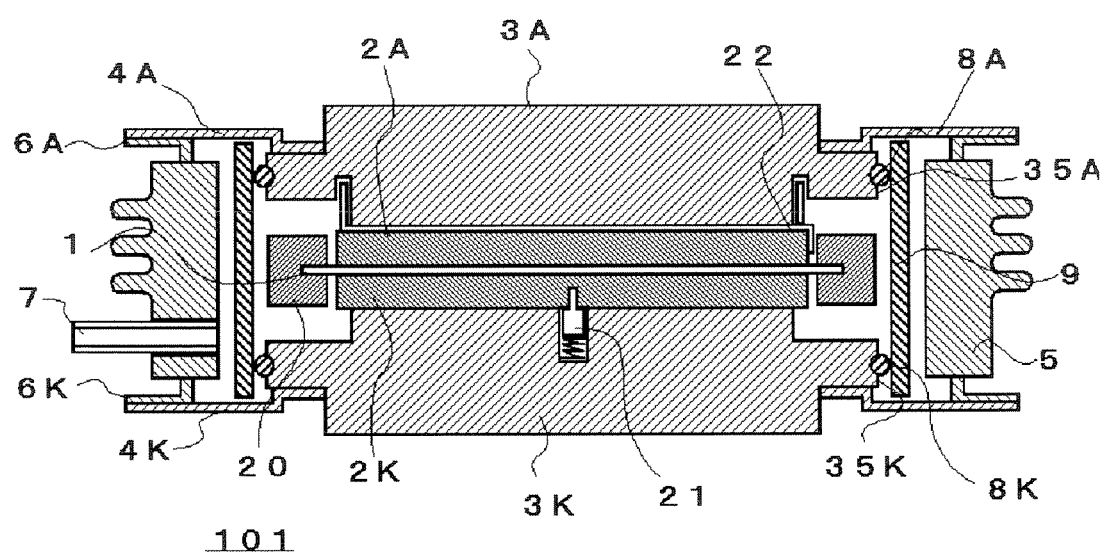
FIG. 4 is a cross-sectional view illustrating a pressure-contact semiconductor device according to Embodiment 3 of the present invention.
Figure 5:
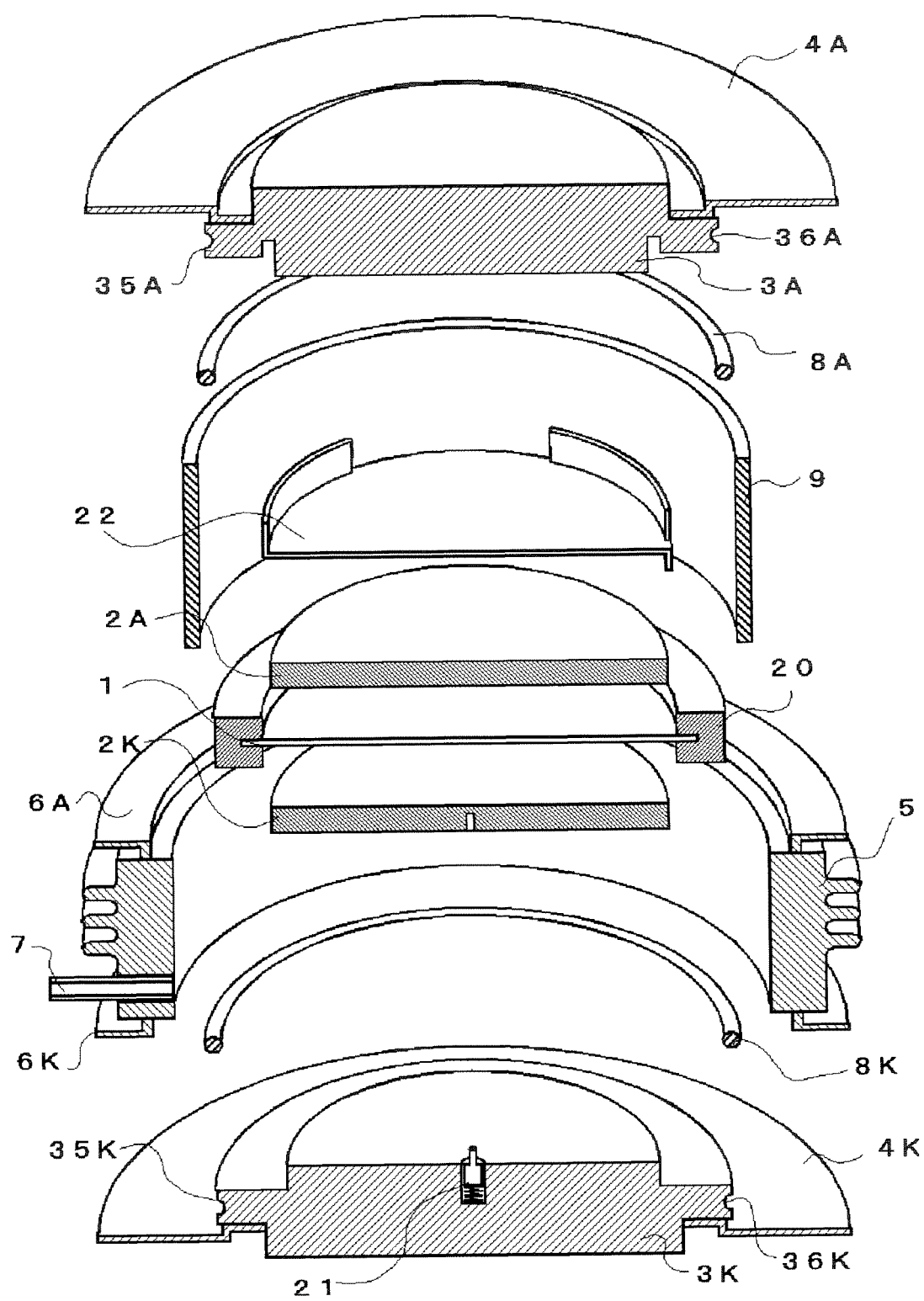
FIG. 5 is a perspective cross-sectional view illustrating a configuration of the pressure-contact semiconductor device according to Embodiment 3 of the invention.

FIG. 4 is a cross-sectional view illustrating a pressure-contact semiconductor device 101 in Embodiment 3 of the present invention and FIG. 5 is a perspective cross-sectional view illustrating a configuration thereof before assembly. Referring to FIGS. 4 and 5, similar to Embodiment 1, the semiconductor substrate 1 has the anode and cathode electrodes on the pair of main surfaces: the front and back surfaces thereof. The pair of thermal buffer plates 2 and the pair of main electrode blocks 3 each are disposed on the anode and cathode sides, so that the semiconductor substrate 1 is sandwiched therebetween. The main electrode blocks 3 are attached with the flanges 4 and the cylindrical insulating container 5 made of an insulating material is provided with the flanges 6 on the top and bottom ends thereof. The semiconductor device 101 is configured in such a package structure that the semiconductor substrate 1 is enclosed by the main electrode blocks 3 and the insulating container 5 together with the flanges 4 and the flanges 6, in a gastight space sealed by joining the flanges 4 to the flanges 6. In addition, the gas-replacement pipe 7 is provided extending through the lateral side of the insulating container 5 so that gas in the gastight space can be replaced with inert gas through the pipe.

In Embodiment 3, the main electrode blocks 3 on the anode and cathode sides have outer peripheral surfaces 35 in the gastight space, whose diameters are larger than that of the semiconductor substrate 1. The O-rings 8 are fitted in grooves 36 formed in the outer peripheral surfaces 35. The hollow cylindrical insulator 9 is fitted across each of the outer peripheral surfaces 35: the anode-side and cathode-side surfaces so that the O-rings 8 are clamped between each of the main electrode blocks 3 and the insulator, that is, pressing force is exerted on the O-rings 8 in radial directions by the main electrode blocks 3 and the insulator 9.

Here, an assembly process of the pressure-contact semiconductor device 101 in Embodiment 3 will be briefly explained as follows:

(a) First, the anode and cathode sides of the main electrode blocks 3 having been attached with the flanges 4 are prepared, and the O-rings 8 are placed in the grooves 36 formed in the outer peripheral surfaces 35 of the main electrode blocks 3;

(b) The insulating container 5 is prepared, and the flange 6K extending from the bottom end thereof and the flange 4K of the cathode-side main electrode block 3K are welded together;

(c) The thermal buffer plate 2K, the semiconductor substrate 1, and the anode-side thermal buffer plate 2A are stacked on the main electrode block 3K and fixed in place with the positioning pin 21 and the positioning member 22;

(d) The insulator 9 is fitted onto the main electrode block 3K having been provided with one of the O-rings 8 on an outer periphery 35K; and (e) Finally, the anode-side main electrode block 3A is stacked on the thermal buffer plate 2A with the outer peripheral surface 35A being fitted into the insulator 9, and the flange 6A extending from the top end of the insulating container 5 and the flange 4A of the anode-side main electrode block 3A are welded together.

Up to that process, the assembly is completed.

The pressure-contact semiconductor device 101 configured as described above is provided with the insulator 9 between the semiconductor substrate 1 and each of the flanges 4 and the flanges 6 to eliminate clearances between each of the main electrode blocks 3 and the insulator 9 by placing the O-rings 8, which can suppress arcs, generated accompanied by breakage of the semiconductor substrate due to a short circuit current or the like, from blowing out from the flanges 4 and the flanges 6 to outside the device package as with Embodiment 1.

Moreover, the above-described configuration eliminates necessity for high dimensional accuracy and for press-fitting of elastic members in the assembly process, which improves workability, allowing the device to be manufactured at low cost as with Embodiment 1.

Furthermore, since a conventional pressure-contact semiconductor device is configured such that elastic members cover flange portions, which involves a relatively large usage of silicon rubber, gas may sometimes be produced in long-term use depending on its use environment. In the configuration of Embodiment 1, on the contrary, since use of silicon rubber is limited to the O-rings, the usage can be reduced, which can also suppress gas production.

Embodiment 4

Figure 6:
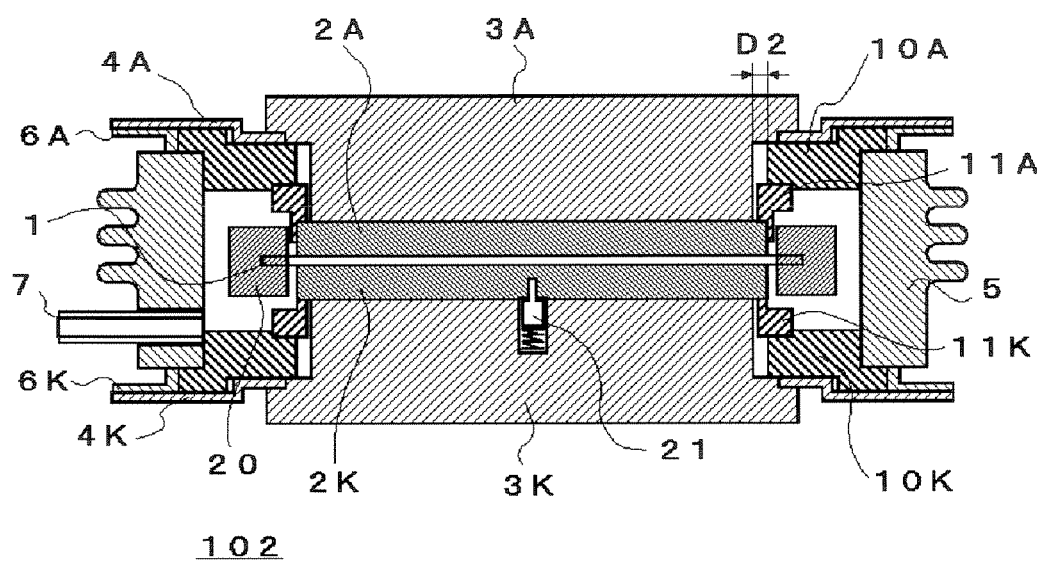
FIG. 6 is a cross-sectional view illustrating a pressure-contact semiconductor device according to Embodiment 4 of the present invention.
Figure 7:
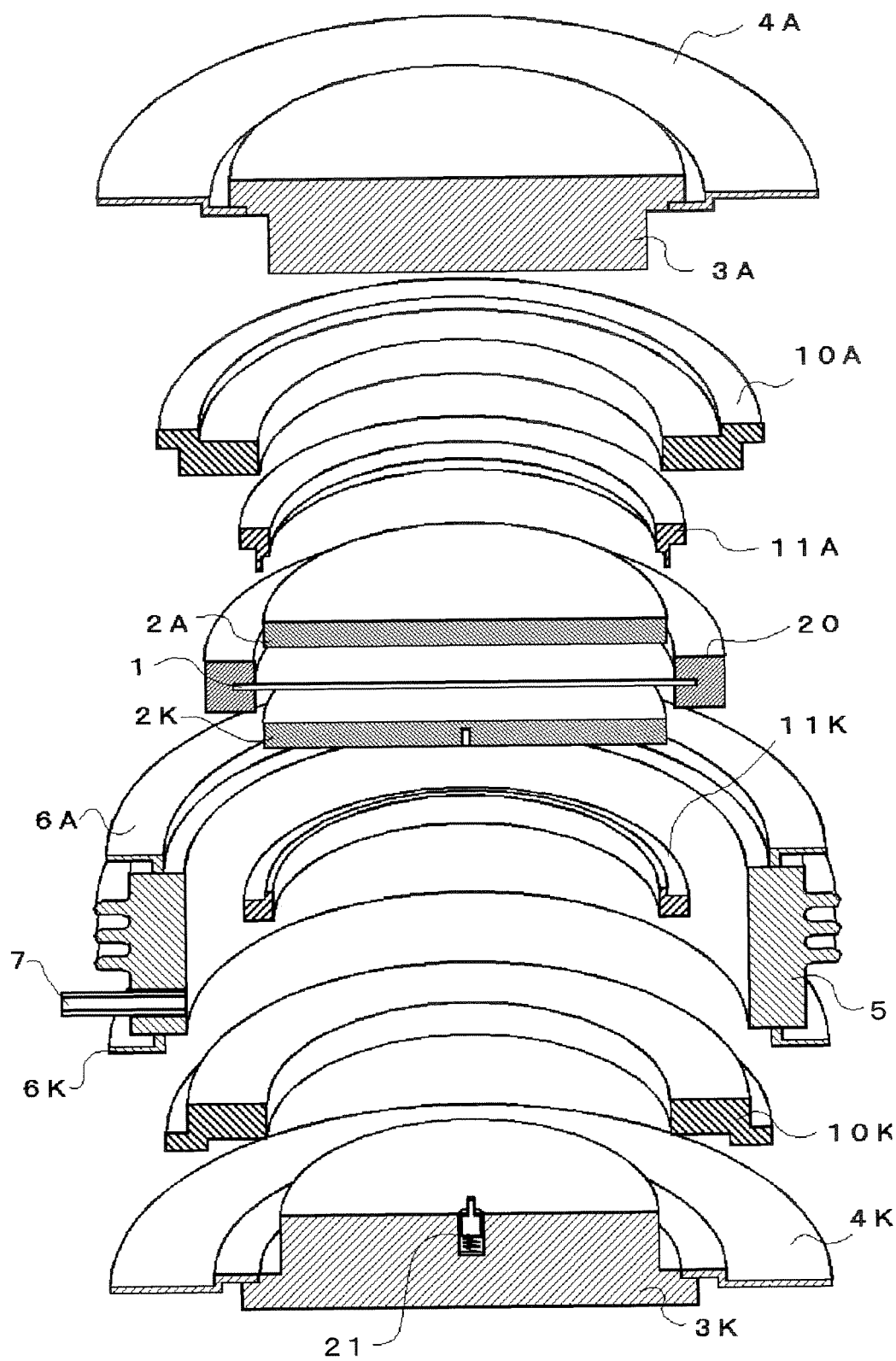
FIG. 7 is a perspective cross-sectional view illustrating a configuration of the pressure-contact semiconductor device according to Embodiment 4 of the invention.

FIG. 6 is a cross-sectional view illustrating a pressure-contact semiconductor device 102 in Embodiment 4 of the present invention, and FIG. 7 is a perspective cross-sectional view illustrating a configuration thereof before assembly. Referring to FIGS. 6 and 7, similar to Embodiment 1, the semiconductor substrate 1 has the anode and cathode electrodes on the pair of main surfaces: the front and back surfaces thereof. The pair of thermal buffer plates 2 and the pair of main electrode blocks 3 are each disposed on the anode and cathode sides, so that the semiconductor substrate 1 is sandwiched therebetween. The main electrode blocks 3 are attached with the flanges 4 and the cylindrical insulating container 5 made of an insulating material is provided with the flanges 6 on the top and bottom ends thereof. The semiconductor device 102 is configured in such a package structure that the semiconductor substrate 1 is enclosed by the main electrode blocks 3 and the insulating container 5 together with the flanges 4 and the flanges 6, in a gastight space sealed by joining the flanges 4 to the flanges 6. In addition, the gas-replacement pipe 7 is provided extending through the lateral side of the insulating container 5 so that gas in the gastight space can be replaced with inert gas through the pipe.

In the gastight space, elastic members 10 each are additionally provided for covering the anode and cathode sides of the flanges 4 and the flanges 6, and rings 11 are also provided supported on inner peripheries of the elastic members 10 and the outer peripheries of the thermal buffer plates 2 opposed thereto.

The elastic members 10 suppress arcs from breaking through the flanges 4 and the flanges 6 by covering them when the semiconductor substrate 1 is overloaded. For that reason, silicon rubber, fluororubber, or the like, which has high thermal stability (200° C. or higher), is used for the elastic members 10. On the other hand, the rings 11 are disposed between the elastic members 10 and the main electrode blocks 3 so that clearances are filled therewith, which are necessary for assembly, and are further configured to seal the inside by its elastic force. Consequently, the rings 11 suppress arcs from passing through the clearances between the elastic members 10 and the main electrode blocks 3. Therefore, the rings 11 are preferably made of a metal material of high thermal resistance and rigidity such as iron or copper.

Here, an assembly process of the pressure-contact semiconductor device 102 in Embodiment 4 will be briefly explained as follows:
  (a) First, the cathode-side main electrode block 3K having been attached with the flange 4K is prepared, and an elastic member 10K is attached on the flange 4K;
  (b) The insulating container 5 is prepared, and the flange 6K extending from the bottom end thereof and the flange 4K of the cathode-side main electrode block 3K are welded together;
At that process, an outer periphery of the elastic member 10K is engaged between the flange 4K and the flange 6K, and the bottom end of the insulating container 5;
  (c) A ring 11K is placed on the elastic member 10K and the thermal buffer plate 2K is placed on the electrode block 3K;
Up to that process, the cathode-side configuration has been assembled;
  (d) The semiconductor substrate 1 is placed on the thermal buffer plate 2K;

Then, the assembly proceeds to the anode-side configuration, an assembly process for which is in the order almost reverse to those for the anode side;
  (e) The anode-side thermal buffer plate 2A is placed on the semiconductor substrate 1 and a ring 11A is placed on the thermal buffer plate 2A;
  (f) The elastic member 10A is placed so as to be engaged with the ring 11A and the insulating container 5 on the top end thereof; and
  (g) Finally, the anode-side main electrode block 3A having been attached with the flange is stacked on the thermal buffer plate 2A, and the flange 6A extending from the top end of the insulating container 5 and the flange 4A attached to the anode-side main electrode block 3A are welded together.

Up to that process, the assembly is completed.

In the pressure-contact semiconductor device 102 configured as described above, when the semiconductor substrate 1 is overloaded, the elastic members 10 suppress arcs from directly breaking through the flanges 4 and the flanges 6. At the same time, even if arcs pass through clearances D2 between the elastic members 10 and the main electrode blocks 3 and reach the flanges 4 and the flanges 6, the rings 11 can also suppress the arcs from breaking through the flanges 4 and the flanges 6.

Moreover, since the above-described configuration enables sufficient clearances to be provided necessary for assembly of the main electrode blocks 3 and the insulating container 5 and that eliminates press-fitting of elastic members in the assembly process, parts of high dimensional accuracy are not needed as well as workability is improved, which allows the device to be manufactured at low costs.

Furthermore, since the above-described configuration can basically be configured by adding the rings 10 to a conventional pressure-contact semiconductor device, it is easy to modify from conventional ones, but yet able to demonstrate high explosion-proof performance.

Embodiment 5

Figure 8:
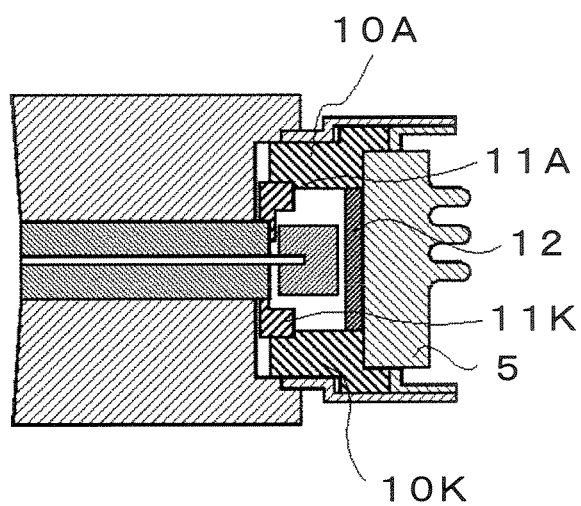
FIG. 8 is a partial cross-sectional view of a pressure-contact semiconductor device according to Embodiment 5 of the present invention.

FIG. 8 is a partial cross-sectional view illustrating a configuration of Embodiment 5 in which a hollow cylindrical insulating resin 12 is disposed on the inner wall of the insulating container 5. In this case, the insulating resin 12 is clamped by the cathode and anode sides of the elastic members 10 opposing each other. A pressure-contact semiconductor device configured as described above can prevent arcs from directly hitting the insulating container 5 when the semiconductor substrate 1 is overloaded. Consequently, the pressure-contact semiconductor device can be configured to demonstrate higher explosion resistance than that of Embodiment 1.

Embodiment 6

Figure 9A:
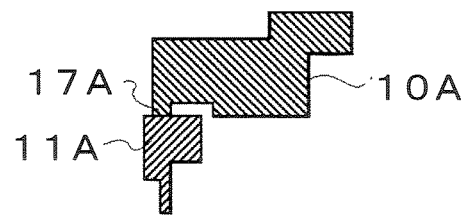
FIGS. 9A and 9B are cross-sectional views illustrating rings and elastic members according to Embodiment 6 of the present invention.
Figure 9B:
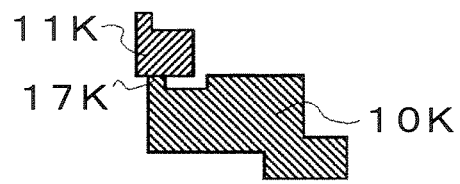

Since, in the configuration of Embodiment 5, large pressing force is exerted on the rings 11 between the anode and cathode sides of the main electrode blocks 3 together with their flanges, and the elastic members 10, the main electrode blocks 3 may sometimes be distorted by the reaction force. Therefore, projecting portions 17 may be formed on the elastic members 10 at portions thereof contacting the respective rings 11 as shown by the cross-sectional views in FIGS. 9A and 9B. In this case, contact pressure on the rings 11 can be adjusted by varying the width of the projecting portions 17 formed on the elastic members 10, which can prevent the main electrode blocks 3 from being distorted.

Embodiment 7

Figure 10A:
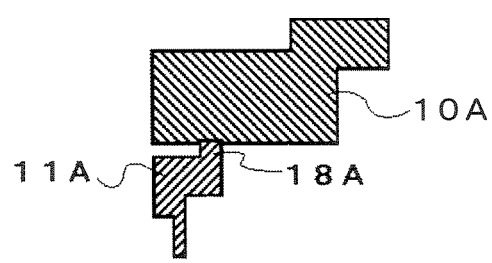
FIGS. 10A and 10B are cross-sectional views illustrating rings and elastic members according to Embodiment 7 of the present invention.
Figure 10B:
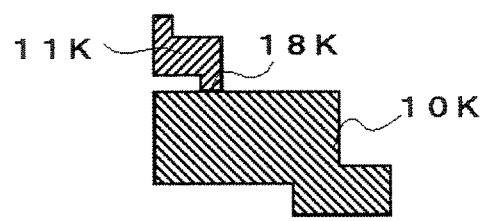

The projecting portions 17 are formed on the elastic members 10 for preventing the distortion of the main electrode blocks 3 in Embodiment 6. Projecting portions 18 may be formed, in contrast, on the rings 11 at portions thereof contacting the elastic members 10 as shown by the cross-sectional views in FIGS. 10A and 10B. In this case also, contact pressure on the elastic members 10 can be adjusted by varying the width of the projecting portions 18 formed on the rings 11, which can also prevent the main electrode blocks 3 from being distorted as with Embodiment 6.

Embodiment 8

Figure 11:
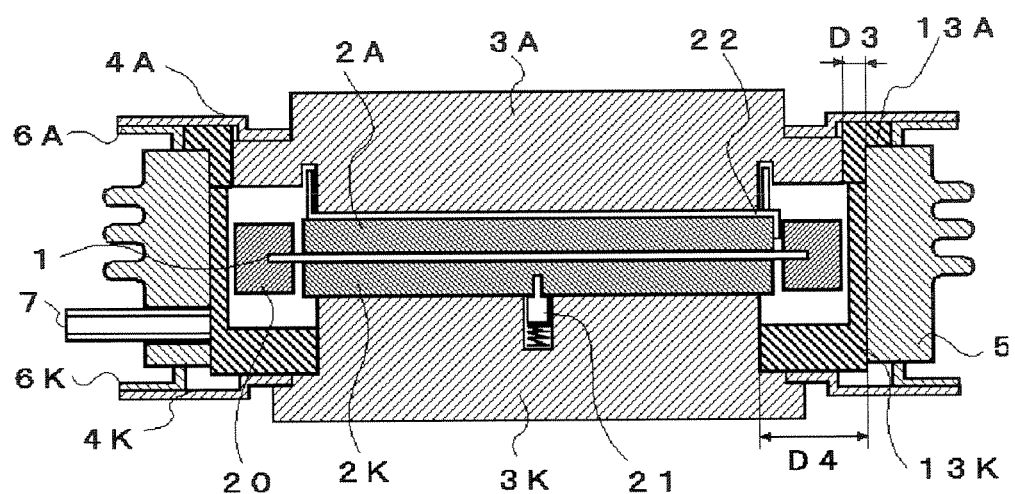
FIG. 11 is a cross-sectional view illustrating a pressure-contact semiconductor device according to Embodiment 8 of the present invention.
Figure 12:
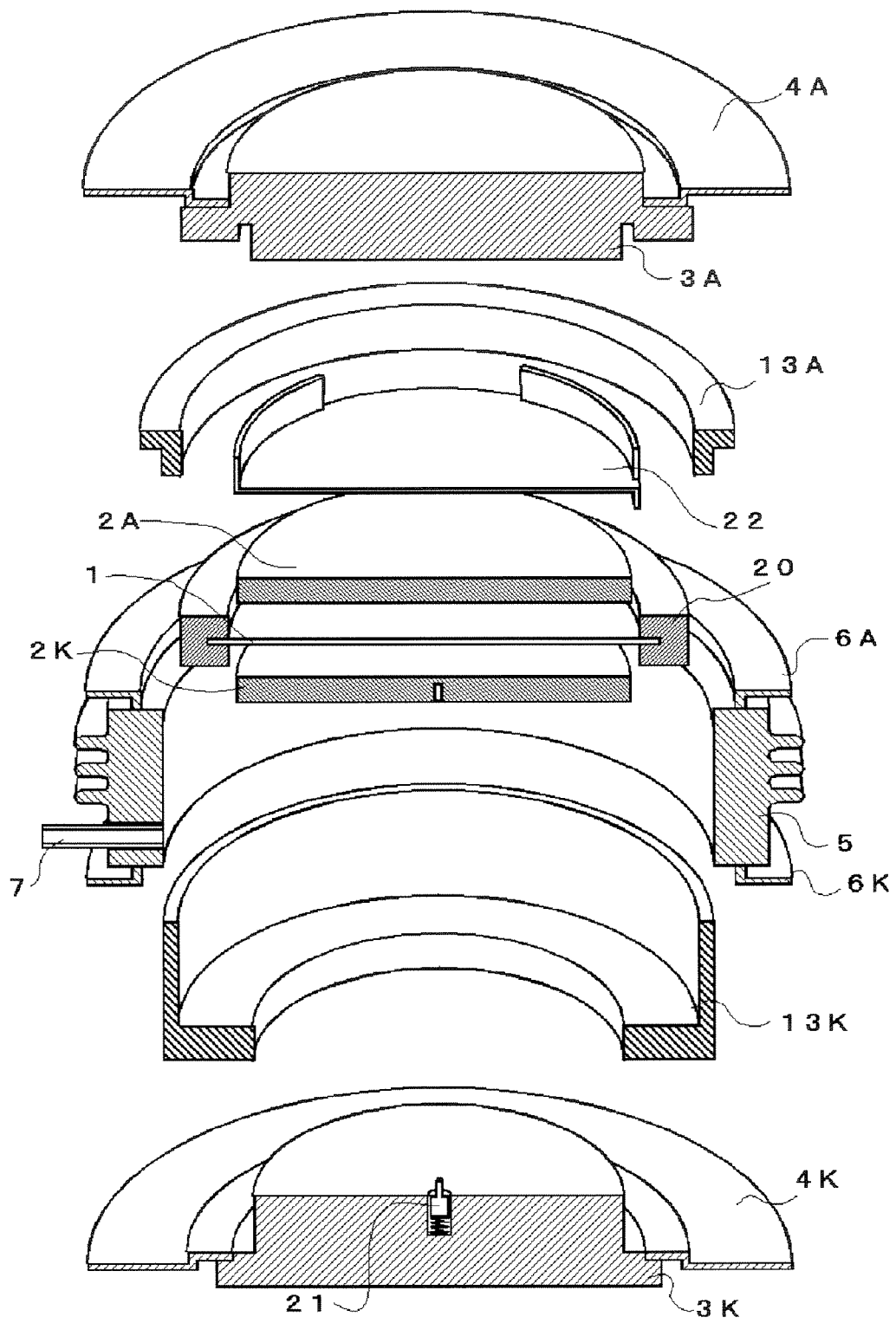
FIG. 12 is a perspective cross-sectional view illustrating a configuration of the pressure-contact semiconductor device according to Embodiment 8 of the invention.

FIG. 11 is a cross-sectional view illustrating a pressure-contact semiconductor device 103 in Embodiment 8 of the present invention, and FIG. 12 is a perspective cross-sectional view illustrating a configuration thereof before assembly. Referring to FIGS. 11 and 12, similar to Embodiment 1, the semiconductor substrate 1 has the anode and cathode electrodes on the pair of main surfaces: the front and back surfaces thereof. The pair of thermal buffer plates 2 and the pair of main electrode blocks 3 each are disposed on the anode and cathode sides, so that the semiconductor substrate 1 is sandwiched therebetween. The main electrode blocks 3 are attached with the flanges 4 and the cylindrical insulating container 5 made of an insulating material has the flanges 6 on the top and bottom ends thereof. The semiconductor device 103 is configured in such a package structure that the semiconductor substrate 1 is enclosed by the main electrode blocks 3 and the insulating container 5 together with the flanges 4 and the flanges 6, in a gastight space sealed by joining the flanges 4 to the flanges 6. In addition, the gas-replacement pipe 7 is provided extending through the lateral side of the insulating container 5 so that gas in the gastight space can be replaced with inert gas through the pipe.

In the gastight space in Embodiment 8, elastic members 13 are additionally provided each on the anode and cathode sides in contact with outer peripheries of the main electrode blocks 3 and the inner wall of the insulating container 5, for covering the anode and cathode sides of the flanges 4 and the flanges 6. The electrode blocks 3 have diameters different from each other at the outer peripheries contacting the elastic members 13 and one of the diameters on the anode side is larger than that on the cathode side. In other words, a cathode-side distance D4 between an cathode-side outer periphery and the inner wall of the insulating container 5 is large and an anode-side distance D3 between an anode-side outer periphery and the inner wall of the insulating container 5 is small, which differences, as a matter of course, are reflected on the sizes of press-fitted elastic member 13A and elastic member 13K.

By making such differences, a pressure-contact semiconductor device is easier to assemble than conventional ones. Hence, an assembly process of the pressure-contact semiconductor device 103 in Embodiment 8 will be briefly explained as follows:

(a) First, the cathode-side main electrode block 3K having been attached with the flange 4K and the insulating container 5 are prepared, and the flange 4K and the flange 6K are welded together;

(b) The elastic member 13K is press-fitted between an outer periphery of the main electrode block 3K and the inner wall of the insulating container 5 so as to cover the flange 4K;

At that process, the elastic member 13K having a width larger than the distance D4 can be press-fitted without hindrance because the main electrode block 3K and the flange 4K serve as a bottom at the press-fitting;

(c) The thermal buffer plate 2K is placed on the main electrode block 3K;

Up to that process, the cathode-side configuration has been assembled;

(d) The semiconductor substrate 1 is placed on the thermal buffer plate 2K;

Then, the assembly proceeds to the anode-side configuration, an assembly process for which is in the order almost reverse to those for the anode side;

(e) The anode-side thermal buffer plate 2A and the positioning member 22 are placed on the semiconductor substrate 1;

(f) The cathode-side elastic member 13K is placed as contacted with the inner wall of the insulating container 5 and the anode-side elastic member 13A is placed so as to be engaged with the insulating container 5 on the top end thereof;

(g) The anode-side main electrode block 3A having been attached with the flange 4A is press-fitted into the insulating container 5 with the elastic member 13A having been placed on the inner wall thereof;

At that process, although if the anode-side elastic member 13A has a large width, it would be distorted so that the main electrode block 3A would be difficult to press-fit due to the distortion as is the case with the cathode-side elastic member 13K, the electrode block 3A is relatively easy to press-fit because the anode-side elastic member 13A has a small width; and (h) Finally, the flange 6A extended from the top end of the insulating container 5 and the flange 4A of the anode-side electrode block 3A are welded together;

Up to that process, the assembly is completed.

In the pressure-contact semiconductor device 103 configured as described above, the elastic members 13 covering the flanges 4 are press-fitted between each of the outer peripheries of the main electrode blocks 3 and the inner periphery of the insulating container 5 so that no clearance is created therebetween. Consequently, when the semiconductor substrate 1 is overloaded, the elastic members 13 can prevent arcs from reaching the flanges 4 and the flanges 6, and can accordingly prevent the arcs from breaking through the flanges 4 and the flanges 6. For that purpose, a machining process such as grinding or abrading is necessary for improving dimensional accuracy of the insulating container 5, the main electrode blocks 3, and the like, which has been a problem with conventional configurations. However, by varying widths of the cathode and anode sides of the elastic member 13K and the elastic member 13A, respectively, it is possible to make the assembly easier as compared to the conventional configurations, allowing the device to be manufactured at low cost.

Embodiment 9

Figure 13:
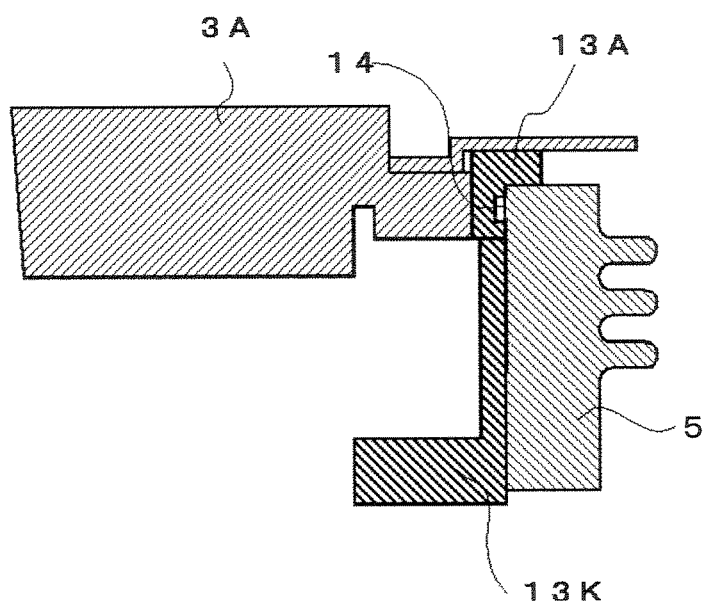
FIG. 13 is a partial cross-sectional view of a pressure-contact semiconductor device according to Embodiment 9 of the present invention.

Although the anode-side elastic member 13A is formed small in width as shown in FIG. 11 in Embodiment 8, the main electrode block 3A may not be press-fitted yet in some cases. With formation of a circumferential groove 14 in a press-fitted portion of the elastic member 13A contacting the outer periphery of the main electrode block 3A or the inner periphery of the insulating container 5 as shown in FIG. 13, it is possible to reduce and adjust friction force generated at the time of the press-fitting, bringing about improvement of assembly.

Embodiment 10

Any of the embodiments described above is characterized in that gastight space structures thereof in a pressure-contact semiconductor device having a package structure in which a semiconductor substrate is sealed in a gastight space by main electrode blocks and an insulating container together with their flanges. In Embodiment 10, provision is made for a pressure-contact semiconductor device further including fin electrodes each contacted with the anode and cathode sides of the main electrode blocks.

Figure 14:
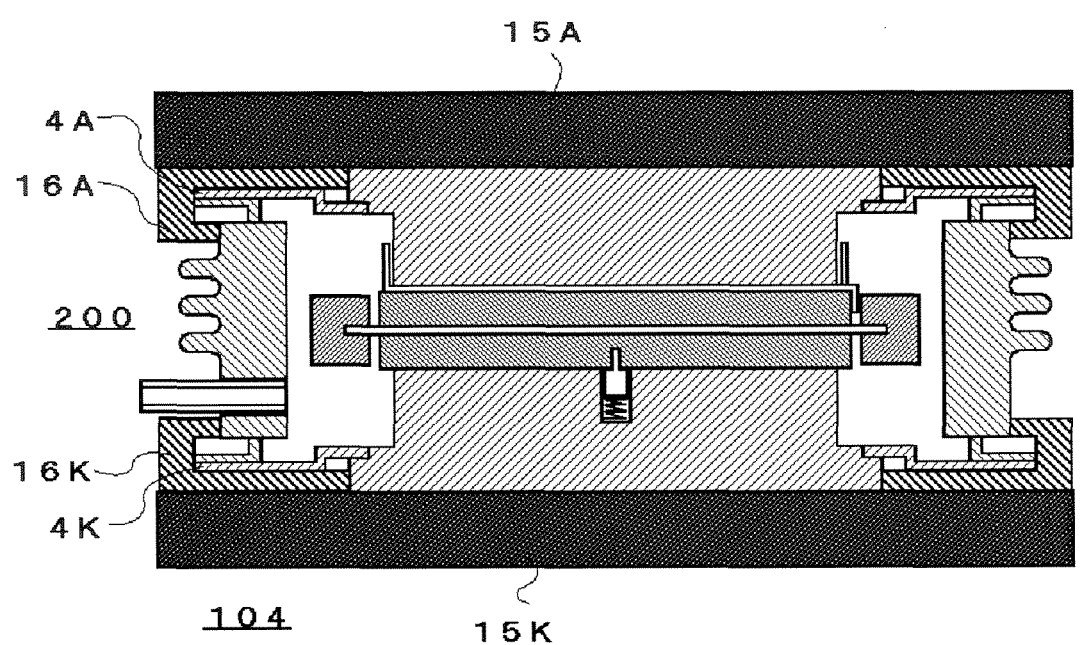
FIG. 14 is a cross-sectional view of a pressure-contact semiconductor device according to Embodiment 10 of the present invention.
Figure 15:
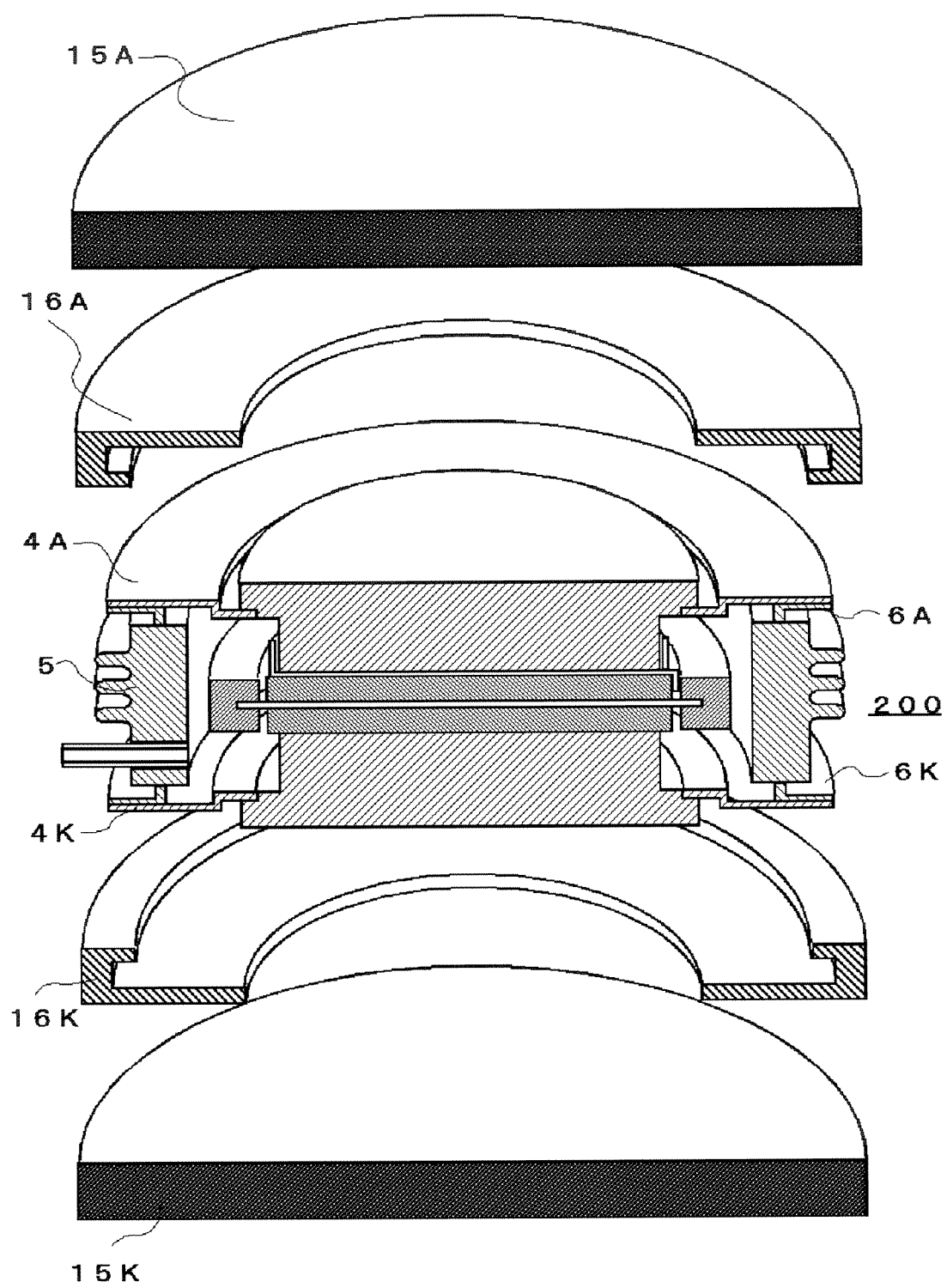
FIG. 15 is a perspective cross-sectional view illustrating a configuration of the pressure-contact semiconductor device according to Embodiment 10 of the invention.

FIG. 14 is a cross-sectional view of a pressure-contact semiconductor device 104 in Embodiment 10 of the present invention and FIG. 15 is a perspective cross-sectional view illustrating the pressure-contact semiconductor device 104 before the fin electrodes are attached thereto. Referring to FIGS. 14 and 15, a pressure-contact semiconductor portion 200, inside which an explosion-proof structure is not necessarily employed, is provided with fin electrodes 15, being in contact with the anode and cathode sides of main electrode blocks, to press the pressure-contact semiconductor portion 200. Elastic members 16 each are sandwiched between the fin electrodes 15 and flanges attached to the semiconductor portion 200. The elastic members 16 are made of silicon rubber, fluororubber, or the like having high thermal stability (200° C. or higher).

In the pressure-contact semiconductor device 104, the elastic members 16 cover the flanges from their outside and the flanges are closely contacted with the elastic members 16 with pressure by the fin electrodes 15. Thereby, even if arcs break through the flanges when the semiconductor substrate is overloaded, the arcs can be prevented from reaching the outside.

Moreover, in a case of no explosion-proof structure being employed inside a package of the pressure-contact semiconductor portion 200, since the semiconductor portion itself is inexpensive, a pressure-contact semiconductor device can be configured with explosion-proof structure at low-cost even if it is assembled by providing the fin electrodes 15 and the elastic members 16.

Figure 16:
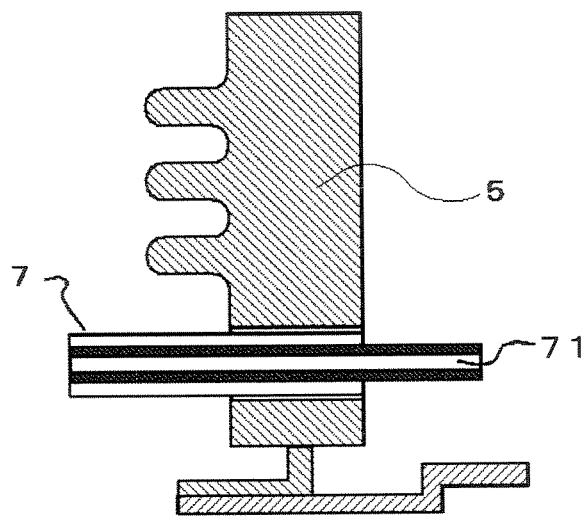
FIG. 16 is a partial cross-sectional view illustrating a gas-replacement pipe according to Embodiment 15 of the present invention.

In addition, in any structure of the pressure-contact semiconductor devices of the embodiments described above, the gas-replacement pipe 7 is provided. Arcs generated from the semiconductor substrate 1 might leak out through the gas-replacement pipe 7. Hence, a second gas-replacement pipe 71 is provided as being inserted into the gas-replacement pipe 7 as shown in FIG. 16. Thereby, a path becomes long through which arcs flow round, which results in that a pressure-contact semiconductor device can be configured that has higher explosion resistance.

What is claimed is:

1. A pressure-contact semiconductor device comprising:
   a semiconductor substrate having a pair of electrodes on a front side and a back side thereof, respectively;
   a pair of thermal buffer plates and a pair of main electrode blocks, each electrode block having a first flange, being provided opposed to the respective electrodes on the semiconductor substrate such that the substrate is sandwiched therebetween, the main electrode blocks respectively having first outer peripheral surfaces and second outer peripheral surfaces, the first outer peripheral surfaces having diameters larger than those of the second outer peripheral surfaces, steps being formed between the first and second outer peripheral surfaces of the main electrode blocks;
   an insulating container provided between the first flanges of the main electrode blocks, surrounding the semiconductor substrate, and having second flanges respectively connected to each of the first flanges;
   O-rings, circular in shape and cross section and having innermost surfaces with inner diameters larger than a diameter of the semiconductor substrate, said innermost surfaces respectively provided in contact with the second outer peripheral surfaces of each of the main electrode blocks so that the O-rings are in contact with the steps; and
   a hollow cylindrical insulator, separated from the insulating container provided in contact with the O-rings, for shielding the semiconductor substrate from the second flanges and the insulating container in cooperation with the main electrode blocks and the O-rings;
   the semiconductor substrate being sealed in a gastight space created by joining the insulating container to the second flanges which are connected to the first flanges, wherein
   the first outer peripheral surfaces and the second outer peripheral surfaces are in the gastight space,
   the steps clamp the hollow cylindrical insulator via the O-rings,
   the hollow cylindrical insulator is fitted across anode and cathode sides of the second outer peripheral surfaces so that the respective O-rings are pressed against the steps in vertical directions toward the semiconductor substrate.

2. The pressure-contact semiconductor device according to claim 1, wherein
   circumferential grooves are formed in the outer peripheral surfaces of the main electrode blocks, and O-rings are fitted into the grooves.

3. The pressure-contact semiconductor device according to claim 1, wherein a first gas-replacement pipe is provided extending through the insulating container and a second gas-replacement pipe made of an insulating material is inserted into the first gas-replacement pipe.

4. The pressure-contact semiconductor device according to claim 1, wherein:
   each of said first and second flanges are metallic, and
   pairs of said first and second flanges are welded together to provide the gastight space.

5. A pressure-contact semiconductor device comprising:
   a semiconductor substrate having a pair of electrodes on a front side and a back side thereof, respectively;
   a pair of thermal buffer plates provided opposed to the respective electrodes on the semiconductor substrate;
   a pair of main electrode blocks provided opposed to the respective thermal buffer plates, each main electrode block having a first flange, the main electrode blocks respectively having first outer peripheral surfaces and second outer peripheral surfaces, the first outer peripheral surfaces having diameters larger than those of the second outer peripheral surfaces, steps being formed between the first and second outer peripheral surfaces of the main electrode blocks;
   an insulating container provided between the first flanges of the main electrode blocks, and having second flanges respectively connected to each of the first flanges;
   O-rings, circular in shape and cross section and having innermost surfaces with inner diameters larger than a diameter of the semiconductor substrate, said innermost surfaces respectively provided in contact with the second outer peripheral surfaces of each of the main electrode blocks so that the O-rings are in contact with the steps; and
   a hollow cylindrical insulator, separated from the insulating container and provided inside the insulating container, the hollow cylindrical insulator being in contact with the O-rings and having no contact with the semiconductor substrate,
   wherein
   the steps clamp the hollow cylindrical insulator via the O-rings,
   the hollow cylindrical insulator is fitted across anode and cathode sides of the second outer peripheral surfaces so that the respective O-rings are pressed against the steps in vertical directions towards the semiconductor substrate.

6. The pressure-contact semiconductor device according to claim 5, wherein the semiconductor substrate is in contact with the thermal buffer plates and larger than the thermal buffer plates in diameter.

7. The pressure-contact semiconductor device according to claim 6, further comprising a protector provided on the outermost peripheral portion of the semiconductor substrate, the protector having no contact with the hollow cylindrical insulator.

8. The pressure-contact semiconductor device according to claim 1, wherein the hollow cylindrical insulator is made of fluoropolymer or polyimide.

9. The pressure-contact semiconductor device according to claim 1, wherein said O-rings are separate members with respect to said hollow cylindrical insulator and are made of a material different than that of said hollow cylindrical insulator.

10. The pressure-contact semiconductor device according to claim 1, wherein:
    said hollow cylindrical insulator has an inner surface having a diameter larger than said semiconductor substrate in contact with first surfaces of each of said electrode blocks; and
    said O-rings are in contact with upper and lower surfaces of the hollow cylindrical insulator and in contact with second surfaces of said electrode blocks substantially perpendicular to said first surfaces.

11. The pressure-contact semiconductor device according to claim 5, wherein said O-rings are separate members with respect to said hollow cylindrical insulator and are made of a material different than that of said hollow cylindrical insulator.

12. The pressure-contact semiconductor device according to claim 5, wherein:
    said hollow cylindrical insulator has an inner surface having a diameter larger than said semiconductor substrate in contact with first surfaces of each of said electrode blocks; and
    said O-rings are in contact with upper and lower surfaces of the hollow cylindrical insulator and in contact with second surfaces of said electrode blocks substantially perpendicular to said first surfaces.

13. The pressure-contact semiconductor device according to claim 1, wherein
    the O-ring is formed by rubber, and the hollow cylindrical insulator is formed by a material other than rubber.

* * * * *